United States Patent
Odiz et al.

(10) Patent No.: US 9,690,890 B1
(45) Date of Patent: Jun. 27, 2017

(54) CREATING AND USING A WIDE-BUS DATA STRUCTURE TO REPRESENT A WIDE-BUS IN AN INTEGRATED CIRCUIT (IC) DESIGN

(71) Applicant: Synopsys, Inc., Mountain View, CA (US)

(72) Inventors: Eyal Odiz, Los Altos Hills, CA (US); Jovanka Ciric Vujkovic, Mountain View, CA (US); Van E. Morgan, Phoenixville, PA (US); Janet L. Olson, Saratoga, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 15/295,809

(22) Filed: Oct. 17, 2016

(51) Int. Cl.
  *G06F 17/50* (2006.01)
  *G06F 17/30* (2006.01)

(52) U.S. Cl.
  CPC ...... *G06F 17/505* (2013.01); *G06F 17/30979* (2013.01)

(58) Field of Classification Search
  CPC .................. G06F 17/505; G06F 17/30979
  USPC ............................................. 716/104
  See application file for complete search history.

(56) References Cited

U.S. PATENT DOCUMENTS

| | | | | |
|---|---|---|---|---|
| 5,726,902 A | * | 3/1998 | Mahmood | G06F 17/5045 716/102 |
| 2006/0101187 A1 | * | 5/2006 | Filor | 710/315 |

* cited by examiner

*Primary Examiner* — Suchin Parihar
(74) *Attorney, Agent, or Firm* — Park, Vaughan, Fleming & Dowler LLP; Laxman Sahasrabuddhe

(57) ABSTRACT

Systems and techniques are described for designing an integrated circuit (IC). Some embodiments explicitly represent wide-buses as distinct objects in an IC design data model. One or more IC design representations that are used in an IC design flow may natively support such wide-bus objects. These new objects can enable rapid access and preservation of wide-buses, thereby improving the runtime and/or quality of results (QoR) of an IC design system.

12 Claims, 12 Drawing Sheets

---

Receive an HDL description of an IC design, wherein the HDL description includes an HDL statement that performs a logical operation on more than two inputs — 202

Enumerate the HDL description to obtain an enumerated IC design, wherein the enumerated IC design includes a wide-gate data structure that represents the logical operation on more than two inputs — 204

Synthesize the enumerated IC design to obtain a synthesized IC design, wherein the synthesized IC design includes (1) a wide-gate data structure that represents the logical operation on more than two inputs, (2) a set of individual cell data structures that implement the logical operation on more than two inputs, and (3) references that bidirectionally link the wide-gate data structure with the set of individual cell data structures — 206

US 9,690,890 B1

CREATING AND USING A WIDE-BUS DATA STRUCTURE TO REPRESENT A WIDE-BUS IN AN INTEGRATED CIRCUIT (IC) DESIGN

BACKGROUND

Technical Field

This disclosure relates to integrated circuits (ICs). More specifically, this disclosure relates to creating and using a wide-bus data structure to represent a wide-bus in an IC design.

Related Art

Advances in process technology and an almost unlimited appetite for consumer electronics have fueled a rapid increase in the size and complexity of IC designs. Software tools can be used to perform various operations on IC designs, e.g., creating and editing schematics and layouts; synthesizing, optimizing, and verifying IC designs; etc. What are needed are high-performance user-friendly software tools that enable an IC designer to create IC designs that reduce the overall IC design time and/or improve the overall quality of results (QoR).

SUMMARY

Some embodiments described herein provide techniques and systems for creating and using a wide-bus data structure to represent a wide-bus in an IC design. During operation, an IC design system can receive a hardware description language (HDL) description of an IC design, wherein the HDL description includes an HDL statement that defines a multi-bit variable, wherein the multi-bit variable represents a bus. Next, the IC design system can enumerate the HDL description to obtain an enumerated IC design, wherein the enumerated IC design includes a first wide-bus data structure that represents the multi-bit variable. The IC design system can then synthesize the enumerated IC design to obtain a synthesized IC design, wherein the synthesized IC design includes (1) a second wide-bus data structure that represents the multi-bit variable, (2) a set of individual wire data structures that represents individual wires in the bus, and (3) references that bidirectionally link the second wide-bus data structure with the set of individual wire data structures. The first wide-bus data structure can be the same as the second wide-bus data structure if the same data format or language is used for representing the enumerated IC design and the synthesized IC design. On the other hand, the first wide-bus data structure can be different from the second wide-bus data structure if different data formats or languages are used for representing the enumerated IC design and the synthesized IC design.

In some embodiments, the IC design system can receive a query that includes an identifier or a reference for the second wide-bus data structure. Next, the IC design system can use the references that bidirectionally link the second wide-bus data structure with the set of individual wire data structures to provide identifiers or references to the set of individual wire data structures.

In some embodiments, the IC design system can receive a query that includes an identifier or a reference for an individual wire data structure in the set of individual wire data structures. Next, the IC design system can use the references that bidirectionally link the second wide-bus data structure with the set of individual wire data structures to provide an identifier or a reference to the second wide-bus data structure.

In some embodiments, as the IC design progresses through multiple stages of an IC design flow, each representation of the IC design explicitly stores information that bidirectionally links a wide-bus data structure that represents the multi-bit variable with a set of data structures that implement wires corresponding to the multi-bit variable. The runtime and/or the QoR of the embodiments described herein are superior to conventional techniques because these embodiments (1) store a wide-bus data structure that represents the multi-bit variable, and (2) store references that bidirectionally link the wide-bus data structure that represents the multi-bit variable with a set of data structures that implement wires corresponding to the multi-bit variable.

DETAILED DESCRIPTION

Figure 1A:
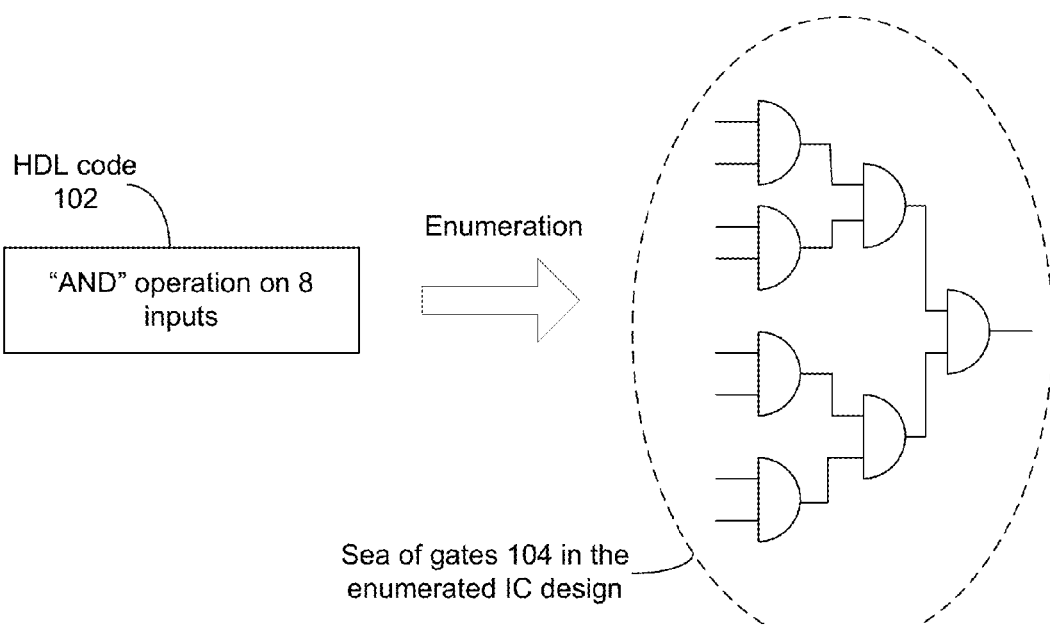
FIG. 1A illustrates how a wide-gate is represented in existing approaches before and after enumeration.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of IC Design and Manufacturing

IC design software tools can be used to create an IC design. Once the IC design is finalized, it can undergo fabrication, packaging, and assembly to produce IC chips. The overall IC design and manufacturing process can involve multiple entities, e.g., one company may create the software for designing ICs, another company may use the software to create the IC design, and yet another company may manufacture IC chips based on the IC design. An IC design flow can include multiple steps, and each step can involve using one or more IC design software tools. An improvement to one or more of these steps in the IC design flow results in an improvement to the overall IC design and manufacturing process. Specifically, the improved IC design and manufacturing process can produce IC chips with a shorter time-to-market (TTM) and/or higher quality of results (QoR). Some examples of IC design steps and the associated software tools are described below. These examples are for illustrative purposes only and are not intended to limit the embodiments to the forms disclosed.

Some IC design software tools enable IC designers to describe the functionality that the IC designers want to implement. These tools also enable IC designers to perform what-if planning to refine functionality, check costs, etc. During logic design and functional verification, the HDL (hardware description language), e.g., SystemVerilog, code can be written and the design can be checked for functional accuracy, e.g., the design can be checked to ensure that it produces the correct outputs.

During synthesis and design for test, the HDL code can be translated to a netlist using one or more IC design software tools. Further, the netlist can be optimized for the target technology, and tests can be designed and implemented to check the finished chips. During netlist verification, the netlist can be checked for compliance with timing constraints and for correspondence with the HDL code. Embodiments described herein can be used in multiple steps of the circuit design flow. Specifically, some embodiments can be used during synthesis, design, and physical implementation.

During design planning, an overall floorplan for the chip can be constructed and analyzed for timing and top-level routing. During physical implementation, circuit elements can be positioned in the layout and can be electrically coupled.

During analysis and extraction, the IC design's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Wide-Gates and Wide-Buses

The functionality of an IC can be specified by using HDL code. The term "enumeration" refers to the process of constructing a network of gates that implements the functionality specified in the HDL code. At a later point in the IC design flow, each gate in the enumerated IC design is implemented using a cell or a network of cells which performs the logical function of the gate. A gate is an abstract model of a circuit in a manufactured IC that performs a logical operation or a logical function (e.g., "AND," "OR," "XOR," "4-to-1 multiplexer," etc.). The characteristics of the actual physical circuit that is being modeled by the gate, e.g., the power consumption (e.g., leakage power and dynamic power), the speed (e.g., delay and transition behavior), the size (e.g., area), etc., are determined by the cell that is used for implementing the gate.

An IC design can be manufactured using different semiconductor manufacturing technologies, and each semiconductor manufacturing technology can correspond to one or more cell libraries that can be used by an IC design software tool. Each cell in a cell library contains information related to a circuit that can be manufactured using the corresponding semiconductor manufacturing technology. For example, the cell can include the layout information which specifies the physical location and the connectivity among different parts (e.g., gate, drain, source, etc.) of a circuit. The cell can also include information about the electrical characteristics, such as the power consumption, speed, and size (i.e., area) of the circuit.

In this disclosure, (1) the term "wide-gate" refers to a gate that represents a logical operation that has more than two, and potentially a variable number of inputs, and (2) the term "wide-bus" refers to a collection of wires that carries information in the IC design. The set of electrical signals carried by a wide-bus corresponds to an information unit, and each electrical signal carried by each wire in the wide-bus corresponds to a portion of the information unit. For example, a wide-bus that has 256 wires can carry a 256-bit data value, wherein each wire in the wide-bus carries one bit of the 256-bit value.

In existing approaches, logical operations that have a large number of inputs are represented by a network of gates in the enumerated IC design. This is because the data format or the language that is used for representing the enumerated IC design does not have a construct to represent a wide-gate that is distinct from the construct that is used to represent an individual 2-input gate, e.g., a 2-input "AND," "OR," "XOR," gate, etc. FIG. 1A illustrates how a wide-gate is represented in existing approaches before and after enumeration. HDL code 102 can include a statement that describes a logical operation on multiple inputs. For example, HDL code 102 can include a statement that describes an "AND" operation on 8 inputs. After enumeration, the EDA tool can create a network of individual gates in the enumerated IC design that implements the 8-input "AND" operation. The network of individual gates is labeled in FIG. 1A as "sea of gates 104" to highlight the fact that the enumerated IC design does not explicitly retain information of the fact that all of the gates in the sea of gates 104 correspond to a single 8-input "AND" operation in the HDL code.

Figure 1B:
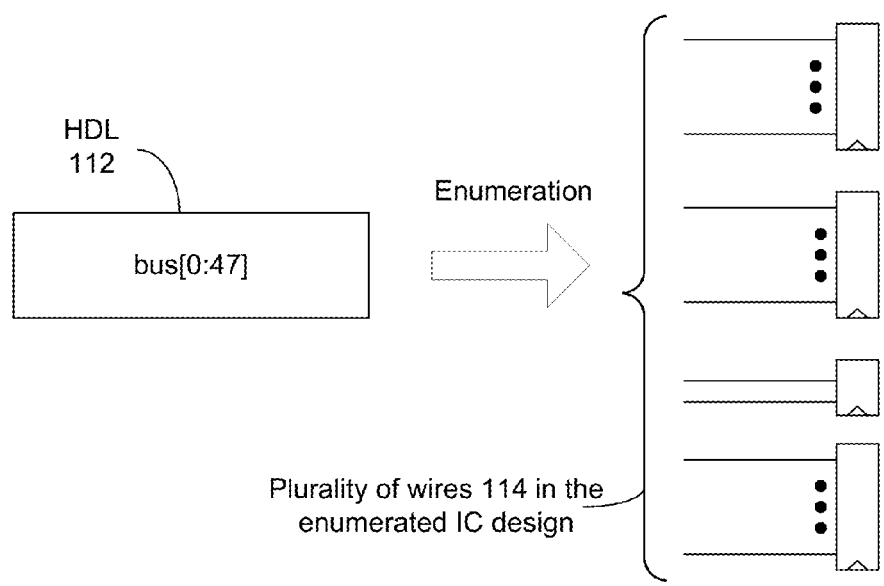
FIG. 1B illustrates how a wide-bus is represented in existing approaches before and after enumeration.

Likewise, in existing approaches, a wide-bus is represented by a plurality of independent wires in the enumerated IC design because the data format or the language that is used for representing the enumerated IC design does not have a construct to represent a wide-bus. Specifically, in existing approaches, the data format or the language that is used for representing the enumerated IC design only has a construct for representing a wire, and this construct is used for representing each individual wire in a wide-bus. FIG. 1B illustrates how a wide-bus is represented in existing approaches before and after enumeration. HDL code 112 can include a statement that defines a multi-bit variable. For example, HDL code 112 can include the statement "bus[0: 47]," which defines a 48-bit variable "bus" that stores a 48-bit value. After enumeration, the EDA tool can create plurality of wires 114 that represents the 48 bits of the variable "bus" (the plurality of wires 114 contains 48 wires, wherein each wire represents a distinct bit in the 48-bit variable "bus"). Note that the plurality of wires 114 does not explicitly retain information of the fact that all of the wires in the plurality of wires 114 correspond to a single 48-bit variable in the HDL code.

Some embodiments described herein are partly motivated by the following insights. If, throughout the IC design flow, the representation of the IC design explicitly retains information (e.g., by way of a new construct) of the fact that certain gates and/or cells in the IC design correspond to a single multi-input logical operation (e.g., an 8-input "AND" operation in the HDL code), then this information can be used to significantly improve the performance and/or QoR of the IC design. Likewise, if, throughout the IC design flow, the representation of the IC design explicitly retains information (e.g., by way of a new construct) of the fact that certain wires in the IC design correspond to a single wide-bus (e.g., a single 48-bit value in the HDL code), then this information can be used to significantly improve the performance and/or QoR of the IC design.

An IC design can be represented using different data formats or languages as the IC design progresses through an IC design flow, wherein the different data formats or languages represent the IC design at different levels of abstraction. In general, higher levels of abstraction contain fewer details of the IC design when compared with lower levels of abstraction. Typically, the IC design is described at a high level of abstraction in the early stages of the IC design flow, and the level of abstraction becomes progressively lower as the IC design moves through the IC design flow. For example, toward the beginning of the IC design flow, an IC design can be described at a high level of abstraction by using an HDL which describes the functionality of the IC design but does not provide any information about the actual geometric shapes that will be printed on the wafer. Toward the end of the IC design flow, the same IC design can be represented in a low level of abstraction by using a data format or language such as GDSII or OASIS, which provides detailed information of the actual geometric shapes that are to be printed on the wafer. In between the two ends of the IC design flow, the IC design may be represented in numerous data formats or languages that describe the same IC design at different levels of abstraction.

Some embodiments described herein introduce new constructs to represent wide-gates and wide-buses as the IC design moves through multiple stages of the IC design flow in which the IC design representation progresses from a high-level representation to a low-level representation. Note that it is important to retain the wide-gate and wide-bus information through multiple stages in the IC design flow in order to fully reap the performance and/or QoR improvements that this information can provide.

Figure 1C:
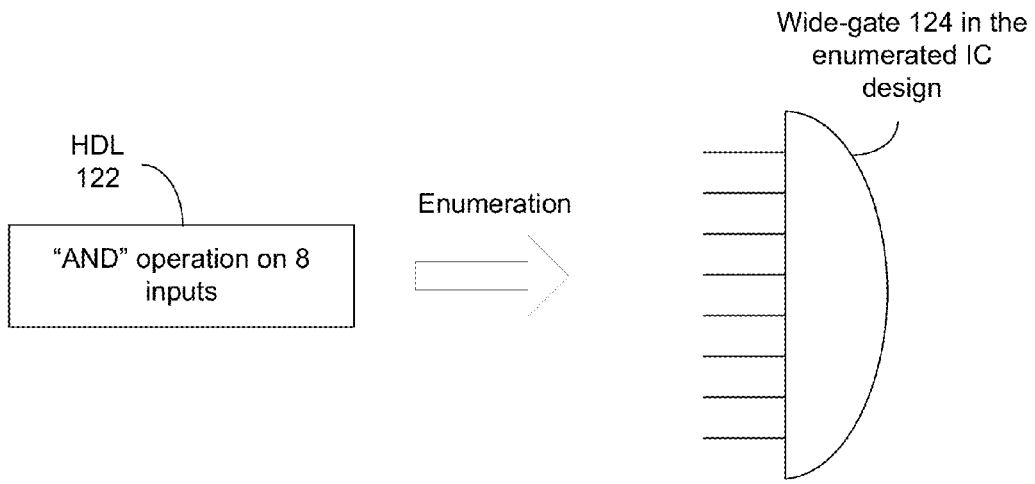
FIG. 1C illustrates a wide-gate construct and illustrates how enumeration can be performed in accordance with some embodiments described herein.

As explained above, a wide-gate construct is a distinct construct that is used to represent a wide-gate in the IC design as the IC design moves through multiple stages of the IC design flow. FIG. 1C illustrates a wide-gate construct and illustrates how enumeration can be performed in accordance with some embodiments described herein. HDL code 122 can include a statement that describes a logical operation on multiple inputs, e.g., HDL code 122 can include a statement that describes an "AND" operation on 8 inputs. After enumeration, the EDA tool can create wide-gate 124 in the enumerated IC design that implements the 8-input "AND" operation. The wide-gate 124 in the enumerated IC design is represented using a new wide-gate construct that is natively supported by the enumerated IC design data format or the enumerated IC design representation language. Note that the wide-gate construct is distinct from a "regular" gate construct that is used for representing 2-input gates, such as 2-input "AND," "OR," "XOR," gates, etc.

Figure 1D:
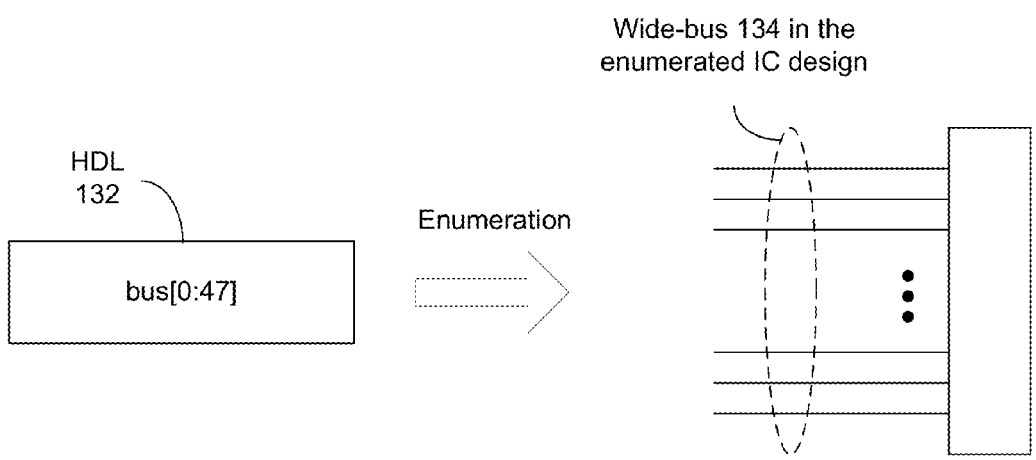
FIG. 1D illustrates a wide-bus construct and illustrates how enumeration can be performed in accordance with some embodiments described herein.

A wide-bus construct is a distinct construct that is used to represent a wide-bus in the IC design as the IC design moves through multiple stages of the IC design flow. FIG. 1D illustrates a wide-bus construct and illustrates how enumeration can be performed in accordance with some embodiments described herein. HDL code 132 can include a statement that defines a multi-bit variable, e.g., HDL code 132 can include a statement that describes the 48-bit variable "bus" as shown in FIG. 1D. After enumeration, the EDA tool can create wide-bus 134 in the enumerated IC design that implements the wide-bus. The wide-bus 134 in the enumerated IC design is represented using a new wide-bus construct that is natively supported by the enumerated IC design data format or the enumerated IC design representation language. Note that the wide-bus construct is distinct from the construct that is used for representing wires.

Figure 1E:
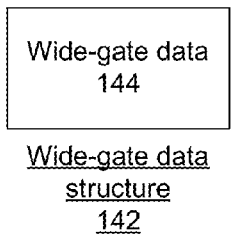
FIGS. 1E-1F illustrate how a wide-gate construct can be stored in memory in accordance with some embodiments described herein.
Figure 1F:
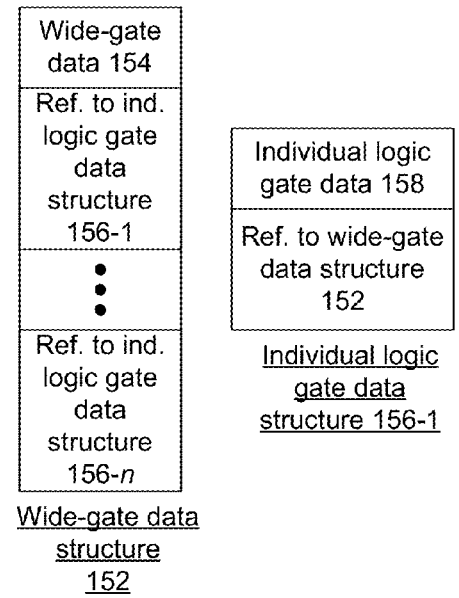

FIGS. 1E-1F illustrate how a wide-gate construct can be stored in memory in accordance with some embodiments described herein. As shown in FIG. 1E, a wide-gate data structure 142 can be created for each instance of a wide-gate construct in an IC design. Wide-gate data structure 142 can contain wide-gate data 144, which can include information about the functionality of the wide-gate (e.g., a field in wide-gate data 144 can specify the logical operation that the wide-gate performs), and a unique identifier that enables an EDA tool to uniquely reference this instance of the wide-gate. At a later point in the IC design flow, this instance of the wide-gate may be implemented using a network of individual logic gates (e.g., 2-input "AND" gates, 2-input "OR" gates, 2-input "XOR" gates, etc.) that provide the functionality of the wide-gate. FIG. 1F illustrates an example of how the wide-gate construct can be stored in memory after the wide-gate has been implemented by a network of logic gates. Specifically, wide-gate data structure 152 can include wide-gate data 154 information about the functionality of the wide-gate, and a unique identifier that enables an EDA tool to uniquely reference this instance of the wide-gate. Wide-gate data structure 152 can also include a set of references (e.g., the references to individual logic gate data structures 156-1 through 156-n shown in wide-gate data structure 152) to the individual logic gates in the network of individual logic gates that implements the functionality of the wide-gate. Each individual logic gate in the network of individual logic gates that implements the functionality of the wide-gate can correspond to a distinct data structure that is stored in memory. For example, FIG. 1F illustrates an example of individual logic gate data structure

156-1 that includes (1) individual logic gate data 158, which can include information about the functionality of the logic gate, and a unique identifier that enables an EDA tool to uniquely reference this instance of the logic gate, and (2) a reference to the wide-gate data structure 152.

The set of forward references to the individual logic gates (or cells) in the network of individual logic gates (or cells) that implements the functionality of the wide-gate (e.g., the references to individual logic gate (or cell) data structures 156-1 through 156-*n* shown in wide-gate data structure 152), and the reverse references to the wide-gate (e.g., the reference to the wide-gate data structure 152 shown in individual logic gate (or cell) data structure 156-1) provide a bidirectional link between the wide-gate and the individual gates (or cells) that implements the functionality of the wide-gate. This bidirectional link can be used to quickly and efficiently access (1) the individual logic gates (or cells) that implement the functionality of a given wide-gate, and conversely (2) the wide-gate whose functionality is being implemented by a given individual logical gate (or cell). Specifically, a query function in an EDA tool can use the data structures shown in FIG. 1F to (1) look up and return a set of individual logic gate (or cell) identifiers or a set of individual logic gate (or cell) references based on a query that specifies an identifier or a reference for a wide-gate, and/or (2) look up and return an identifier or a reference for a wide-gate based on a query that specifies an identifier or a reference for an individual logic gate (or cell).

Figure 1G:
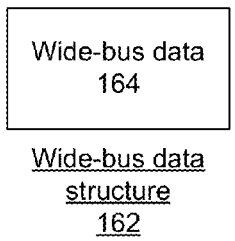
FIGS. 1G-1H illustrate how a wide-bus construct can be stored in memory in accordance with some embodiments described herein.
Figure 1H:
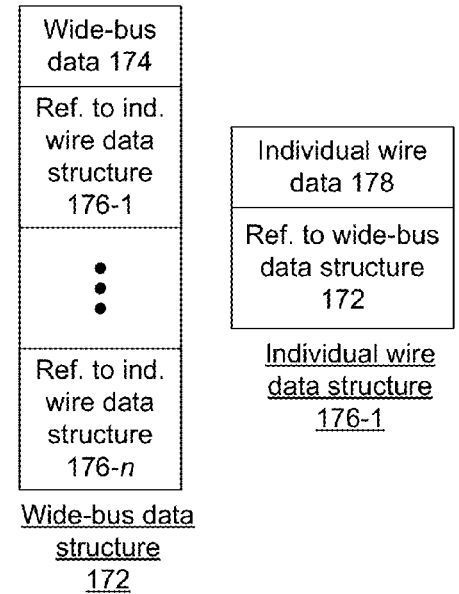

FIGS. 1G-1H illustrate how a wide-bus construct can be stored in memory in accordance with some embodiments described herein. As shown in FIG. 1G, a wide-bus data structure 162 can be created for each instance of a wide-bus construct in an IC design. Wide-bus data structure 162 can contain wide-bus data 164, which can include a unique identifier that enables an EDA tool to uniquely reference this instance of the wide-bus. At a later point in the IC design flow, this instance of the wide-bus may be implemented by a set of wires. FIG. 1H illustrates an example of how the wide-bus construct can be stored in memory after the wide-bus has been implemented by a set of wires. Specifically, wide-bus data structure 172 can include wide-bus data 174, which can include a unique identifier that enables an EDA tool to uniquely reference this instance of the wide-bus. Wide-bus data structure 172 can also include a set of references (e.g., the references to individual wire data structures 176-1 through 176-*n* shown in wide-bus data structure 172) to the individual wires that are used to implement the functionality of the wide-bus. Each individual wire can correspond to a distinct data structure that is stored in memory. For example, FIG. 1H illustrates an example of individual wire data structure 176-1 that includes (1) individual wire data 178, which can include information about the wire (e.g., resistance, capacitance, width, length, metal layer, coordinates of the end-points of the wires, etc.), and a unique identifier that enables an EDA tool to uniquely reference this instance of the wire, and (2) a reference to the wide-bus data structure 172.

The set of forward references to the individual wires that implement the wide-bus (e.g., the references to individual wires 176-1 through 176-*n* shown in wide-bus data structure 172), and the reverse references to the wide-bus (e.g., the reference to the wide-bus data structure 172 shown in individual wire data structure 176-1) provide a bidirectional link between the wide-bus and the individual wires that implements the wide-bus. This bidirectional link can be used to quickly and efficiently access (1) the individual wires that implement the functionality of a given wide-bus, and conversely (2) the wide-bus whose functionality is being implemented by a given individual wire. Specifically, a query function in an EDA tool can use the data structures shown in FIG. 1H to (1) look up and return a set of individual wire identifiers or a set of individual wire references based on a query that specifies an identifier or a reference for a wide-bus, and/or (2) look up and return an identifier or a reference for a wide-bus based on a query that specifies an identifier or a reference for an individual wire.

Figure 1I:
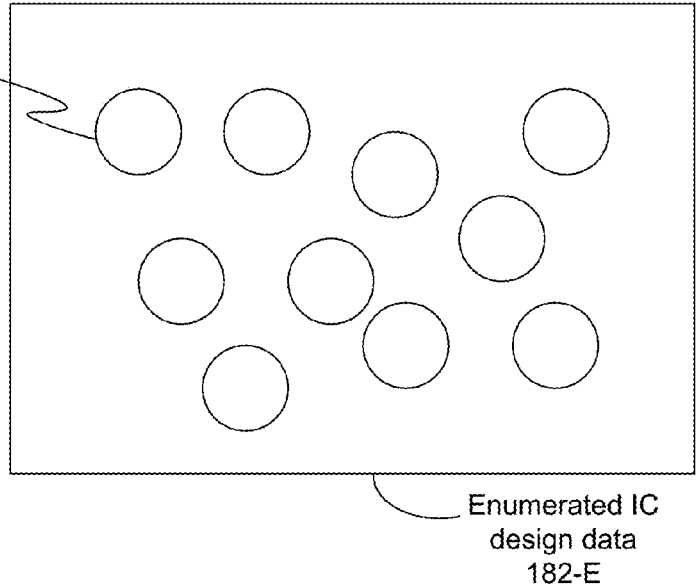
FIGS. 1I-1J illustrate enumerated and synthesized IC design data in existing approaches.
Figure 1J:
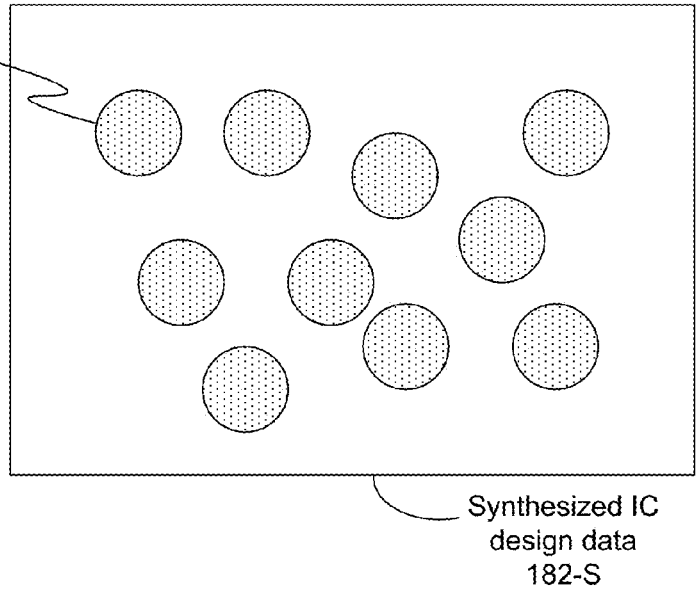

FIGS. 1I-1J illustrate enumerated and synthesized IC design data in existing approaches. In FIGS. 1I-1J, a rectangle represents the entire IC design data, and each circle represents the data for a single gate or cell. Specifically, in FIG. 1I, enumerated IC design data 182-E can include data for each gate corresponding to the sea of gates that implements an 8-input "AND" operation. During synthesis, each gate in the enumerated IC design data 182-E can be implemented by one or more cells that are selected from an appropriate cell library to obtain synthesized IC design data 182-S. As shown in FIG. 1J, synthesized IC design data 182-S can include data for each cell that implements the 8-input "AND" operation (the data corresponding to each cell is shown as a shaded circle in FIG. 1J). Note that enumerated IC design data 182-E and synthesized IC design data 182-S do not explicitly store information of the fact that the gate and cell data shown in FIGS. 1I-1J corresponds to a single 8-input "AND" operation. Likewise, in existing approaches, a correspondence between a wide-bus and the set of wires that implement the wide-bus is also not explicitly stored in the enumerated and synthesized IC design data.

Figure 1K:
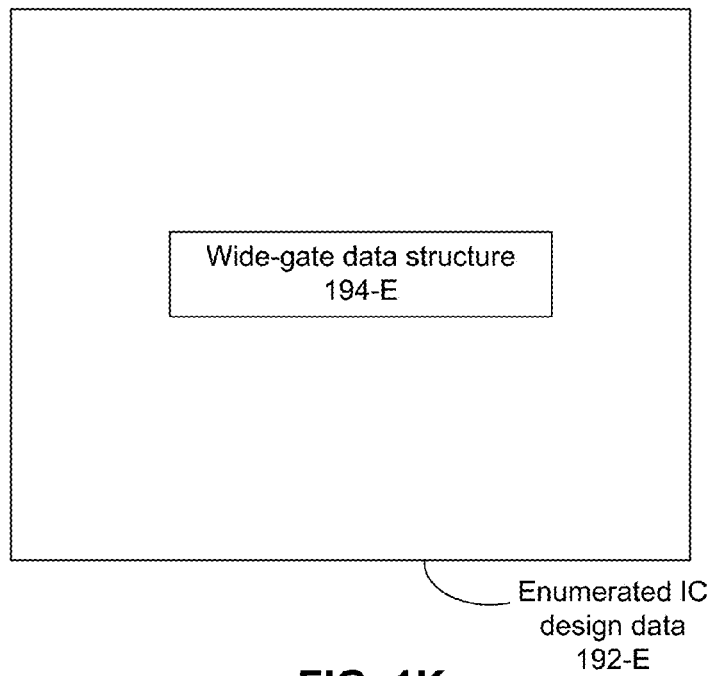
FIGS. 1K-1L illustrate enumerated and synthesized IC design data in accordance with some embodiments described herein.
Figure 1L:
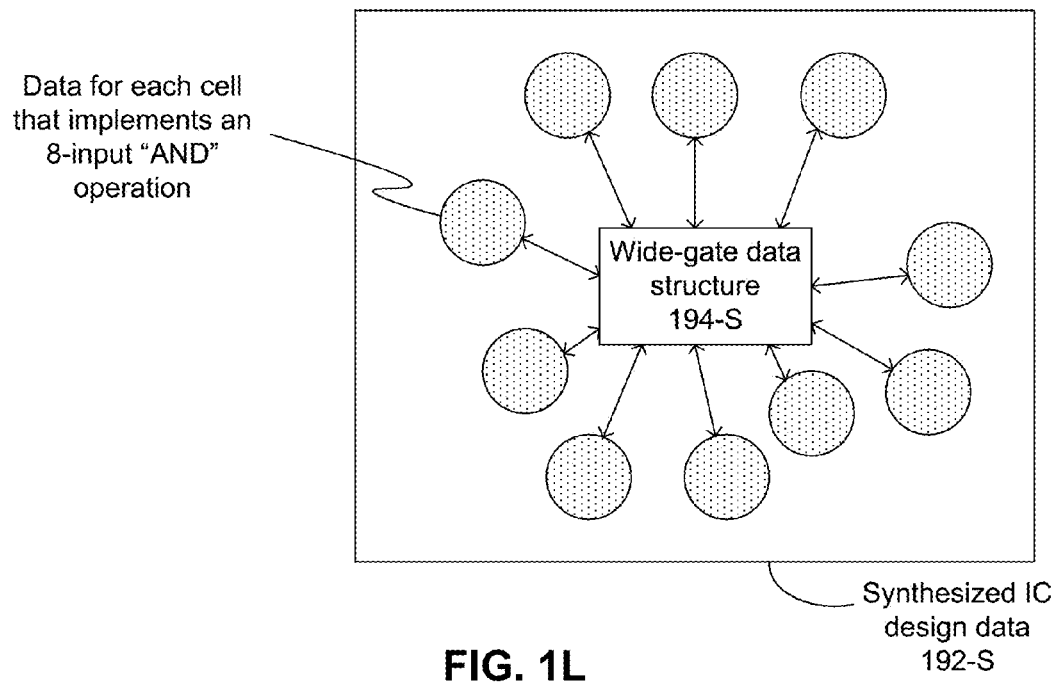

In contrast, FIGS. 1K-1L illustrate enumerated and synthesized IC design data in accordance with some embodiments described herein. In FIG. 1K, a large rectangle represents the entire enumerated IC design data 192-E, and the smaller rectangle inside the large rectangle represents a wide-gate data structure 194-E that corresponds to a wide-gate, e.g., an 8-input "AND" gate. During synthesis, the wide-gate can be implemented by a network of one or more cells that are selected from an appropriate cell library to obtain synthesized IC design data 192-S. As shown in FIG. 1L, synthesized IC design data 192-S can include data for each cell that implements the wide-gate, and also include wide-gate data structure 194-S (the data corresponding to each cell is shown as a shaded circle in FIG. 1L). The bidirectional arrows between each circle that represents a cell data structure and the wide-gate data structure 194-S represent bidirectional links that can be implemented by storing appropriate references in the cell and wide-gate data structures. Note that enumerated IC design data 192-E and synthesized IC design data 192-S explicitly store information of the fact that the gate and cell data shown in FIGS. 1K-1L corresponds to a wide-gate, e.g., an 8-input "AND" operation. Likewise, in some embodiments described herein, a correspondence between a wide-bus and the set of wires that implement the wide-bus is explicitly stored in the enumerated and synthesized IC design data.

Figure 2A:
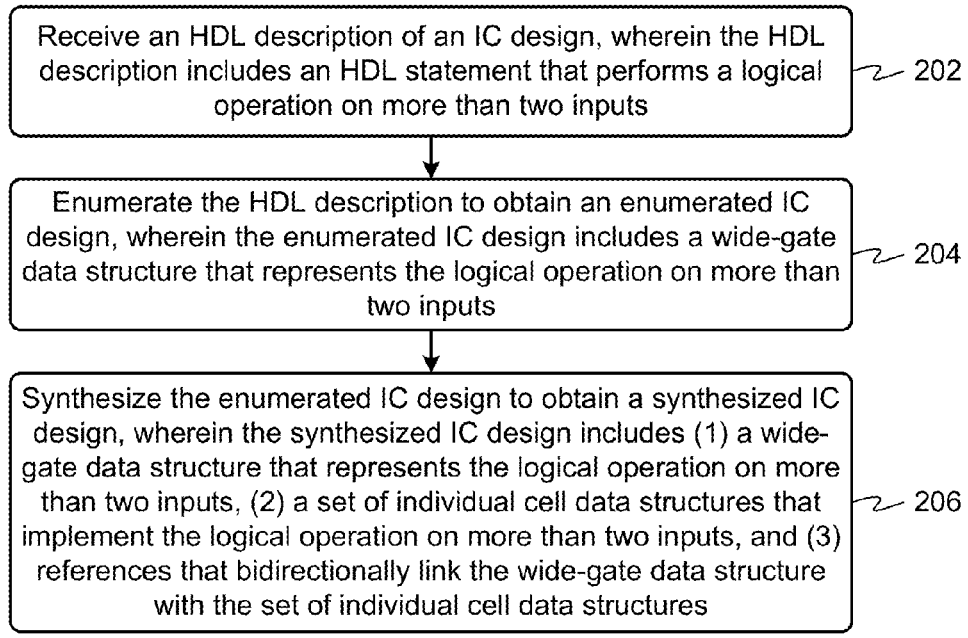
FIG. 2A illustrates a process for using a wide-gate data structure in an IC design flow in accordance with some embodiments described herein.

FIG. 2A illustrates a process for using a wide-gate data structure in an IC design flow in accordance with some embodiments described herein. The process can begin by receiving an HDL description of an IC design, wherein the HDL description includes an HDL statement that performs a logical operation on more than two inputs (block 202). Next, the process can enumerate the HDL description to obtain an enumerated IC design, wherein the enumerated IC design includes a wide-gate data structure that represents the logical operation on more than two inputs (block 204). The process can then synthesize the enumerated IC design to obtain a synthesized IC design, wherein the synthesized IC design includes (1) a wide-gate data structure that represents the logical operation on more than two inputs, (2) a set of individual cell data structures that implement the logical operation on more than two inputs, and (3) references that bidirectionally link the wide-gate data structure with the set of individual cell data structures (block 206).

Figure 2B:
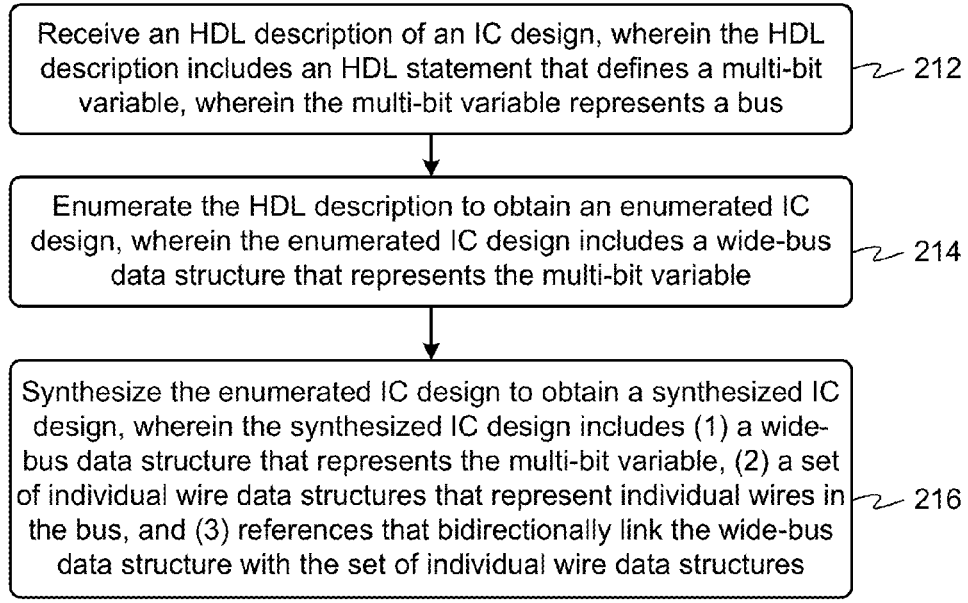
FIG. 2B illustrates a process for using a wide-bus data structure in an IC design flow in accordance with some embodiments described herein.

FIG. 2B illustrates a process for using a wide-bus data structure in an IC design flow in accordance with some embodiments described herein. The process can begin by receiving an HDL description of an IC design, wherein the HDL description includes an HDL statement that defines a multi-bit variable, wherein the multi-bit variable represents a bus (block 212). Next, the process can enumerate the HDL description to obtain an enumerated IC design, wherein the enumerated IC design includes a wide-bus data structure that represents the multi-bit variable (block 214). The process can then synthesize the enumerated IC design to obtain a synthesized IC design, wherein the synthesized IC design includes (1) a wide-bus data structure that represents the multi-bit variable, (2) a set of individual wire data structures that represent individual wires in the bus, and (3) references that bidirectionally link the wide-bus data structure with the set of individual wire data structures (block 216).

IC Design Optimization Using Wide-Gates

A technology-independent wide-gate is a representation of a wide-gate that does not specify all of the characteristics that a typical cell in a cell library would specify, or that uses nominal values for one or more characteristics of the wide-gate. For example, a technology-independent wide-gate may use nominal area and power values, and use a "0" delay value. Likewise, a technology-independent wide-bus is a representation of a wide-bus that does not specify all of the characteristics that a typical bus in a cell library would specify, or that uses nominal values for one or more characteristics of the wide-bus. For example, a technology-independent wide-bus may use nominal values for the capacitance and resistance of the wide-bus.

Figure 2C:
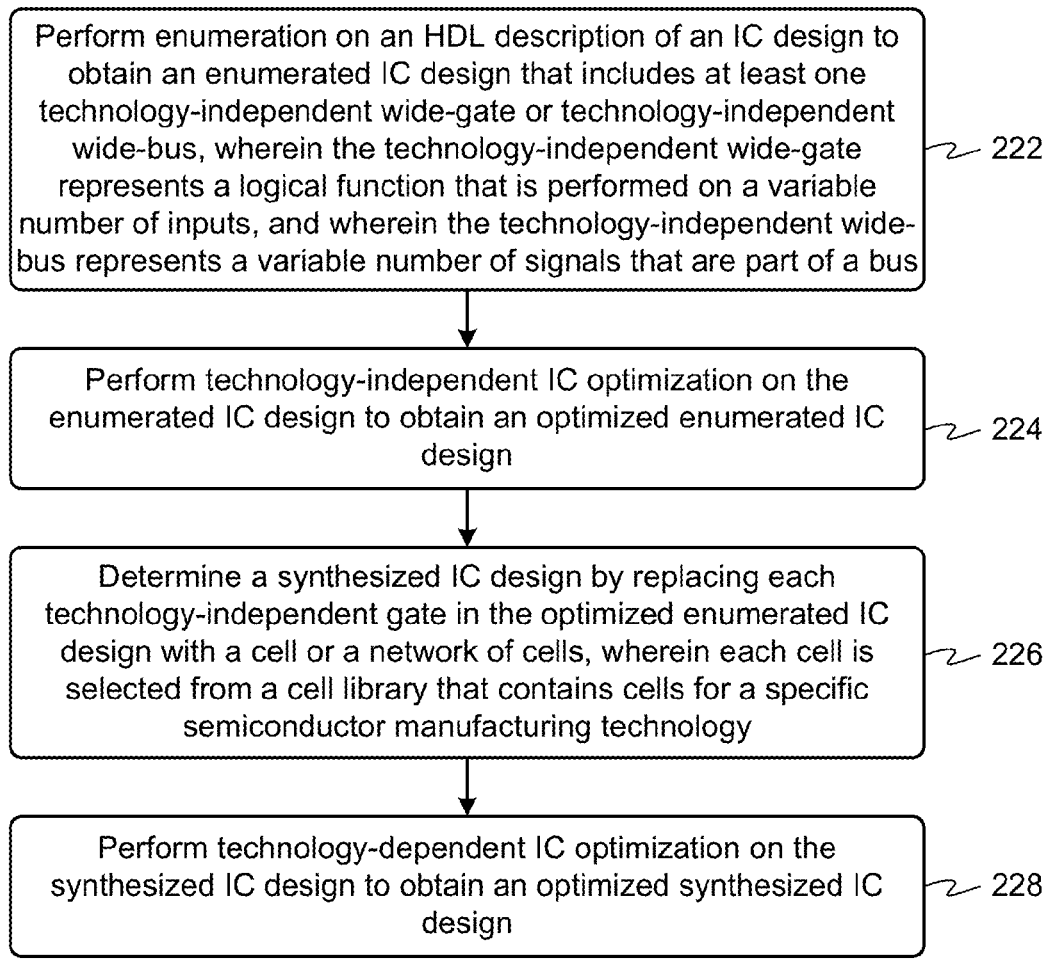
FIG. 2C illustrates a process for optimizing an IC design by using a wide-gate data structure in accordance with some embodiments described herein.

FIG. 2C illustrates a process for optimizing an IC design in accordance with some embodiments described herein. The process can begin by performing enumeration on an HDL description of an IC design to obtain an enumerated IC design that includes at least one technology-independent wide-gate or technology-independent wide-bus, wherein the technology-independent wide-gate represents a logical function that is performed on a variable number of inputs, and wherein the technology-independent wide-bus represents a variable number of signals that are part of a bus (block 222).

Next, the process can perform technology-independent IC optimization on the enumerated IC design to obtain an optimized enumerated IC design (block 224). The term "technology-independent IC optimization" refers to an optimization that is performed on a network of gates that does not take into account the characteristics (e.g., power, delay, area) of the actual circuitry that will be manufactured. For example, a given network of gates may be optimized by replacing the network of gates with a smaller network of gates (i.e., a network of gates that has fewer gates) that has the same logical functionality.

The process can then determine a synthesized IC design by replacing each technology-independent gate in the optimized enumerated IC design with a cell or a network of cells, wherein each cell is selected from a cell library that contains cells for a specific semiconductor manufacturing technology (block 226). Note that a technology-independent gate may correspond to a single cell in the cell library, or if the logical functionality of the technology-independent gate is complex, then the technology-independent gate may correspond to a network of gates.

Next, the process can perform technology-dependent IC optimization on the synthesized IC design to obtain an optimized synthesized IC design (operation block 228). The term "technology-dependent IC optimization" refers to an optimization that is performed on a synthesized IC design that takes into account the characteristics (e.g., power, delay, area) of the actual circuitry that will be manufactured. For example, technology-dependent IC optimization may involve replacing cells with other cells that have the same functionality but that have different delay, power, and area characteristics so that the synthesized IC design meets timing constraints (which ensure that the manufactured IC will operate correctly at a desired clock speed), power constraints (which ensure that the leakage power consumption of the manufactured IC is less than a maximum allowable leakage power consumption and/or the dynamic power consumption of the manufactured IC is less than a maximum allowable dynamic power consumption), and/or area constraints (which ensure that the total area of the manufactured IC is less than a maximum allowable area).

Multi-Bit-Mapping Aware Clock Gating

Clock gating and mapping of register banks are both optimizations to reduce dynamic power. In clock gating, a clock signal is passed through combinational logic before being provided to the clock input of sequential circuit elements (e.g., registers). The combinational logic "gates" (i.e., blocks) the clock signal when the clock is not required (e.g., when a portion of the IC design has been turned off or disabled), thereby reducing dynamic power. In register bank mapping, multiple single-bit registers in the RTL design can be mapped to a single multi-bit register library cell. Note that a single multi-bit register uses the same clock signal for all bits. In some embodiments, clock gating can support multi-bit mapping (i.e., mapping a set of single-bit registers to one or more multi-bit registers), because clock gating before mapping may make neighboring registers in a bank "uniform," i.e., suitable for mapping into a single multi-bit cell, even though the RTL description has the neighboring registers as separate one-bit registers. However, the opposite may happen as well, i.e., the most efficient clock gating solution may prevent mapping to multi-bit register cells.

Figure 3A:
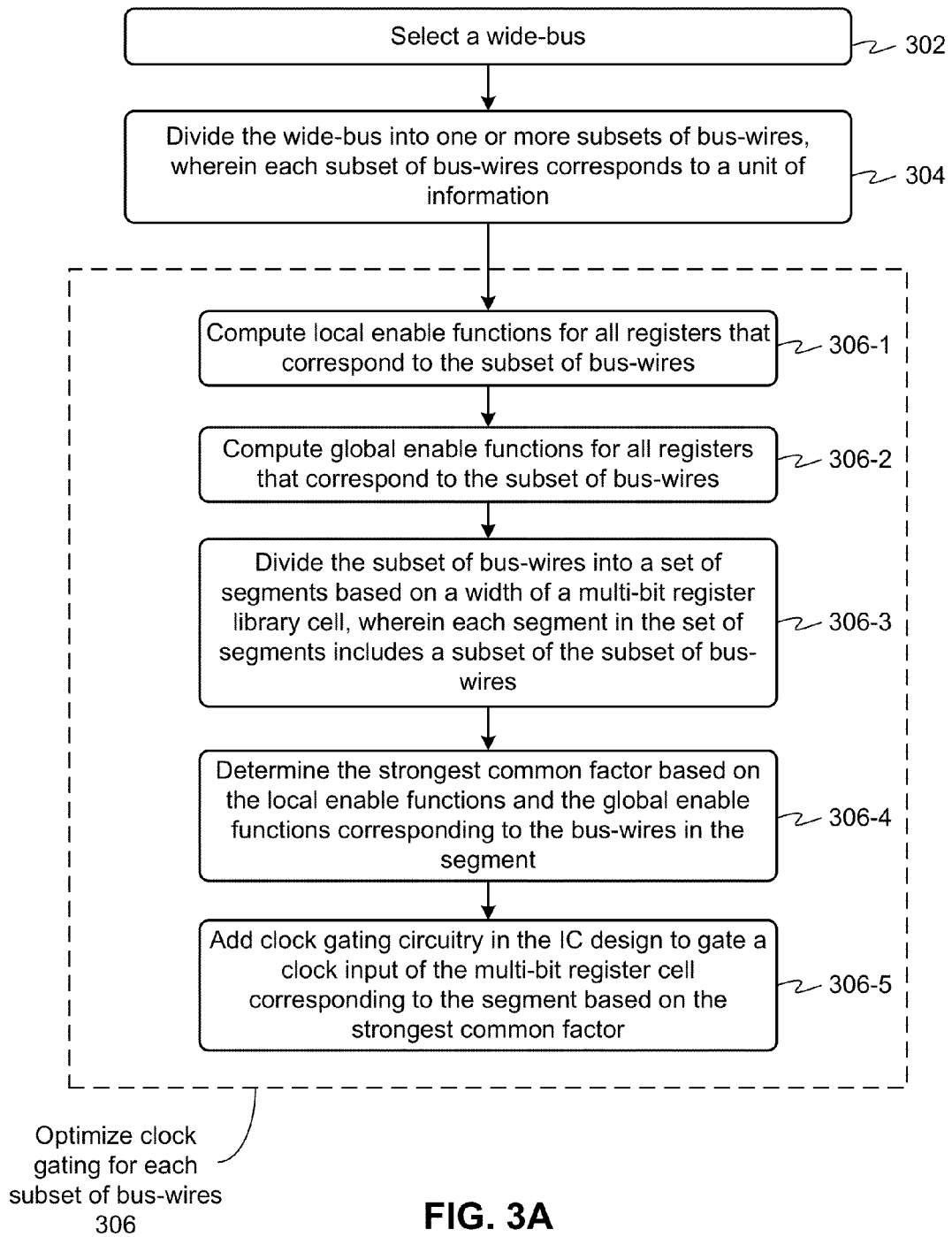
FIG. 3A illustrates a process for optimizing an IC design by using a wide-bus data structure in accordance with some embodiments described herein.

FIG. 3A illustrates a process for optimizing an IC design by using a wide-bus data structure in accordance with some embodiments described herein. The process can begin by selecting a wide-bus (block 302). Next, the process can divide the wide-bus into one or more subsets of bus-wires, wherein each subset of bus-wires corresponds to a unit of information, e.g., a word (block 304). Note that the process can use the wide-bus data structure (see, e.g., FIG. 1H) to quickly identify the bus-wires that comprise the wide-bus. The process can then optimize clock gating on each subset of bus-wires (block 306).

Specifically, a wide-bus may correspond to a multi-dimensional unit of information. Therefore, the process may divide the wires of the wide-bus into distinct subsets that correspond to each dimension in the multi-dimensional unit of information. For example, suppose an IC design includes a 64-bit wide-bus that corresponds to four 16-bit values. In this example, the process may create four subsets of bus-wires having 16 bus-wires each, and optimize clock gating for each of the four subsets of bus-wires. On the other hand, if the 64-bit wide-bus corresponds to a single 64-bit value, then the process may create a single set of 64 bus-wires, and optimize clock gating for the single set of 64 bus-wires.

Specifically, the process can optimize clock gating for a given subset of bus-wires as follows. The process can compute local enable functions for all registers that correspond to the subset of bus-wires (block 306-1). Next, the process can compute global enable functions for all registers that correspond to the subset of bus-wires (block 306-2). The process can then divide the subset of bus-wires into a set of segments based on a width of a multi-bit register library cell, wherein each segment in the set of segments includes a subset of the subset of bus-wires (block 306-3).

Next, for each segment, the process can determine the strongest common factor based on the local enable functions and the global enable functions corresponding to the bus-wires in the segment (block 306-4). In some embodiments, the process can determine the strongest common factor for a given set of logic functions by simplifying a combined logic function that is the logical conjunction (i.e., the logical "AND" operation) of the given set of logic functions. Note that, if all of the logic functions in the given set of logic functions are identical, then the strongest common factor will be one of the logic functions in the given set of logic functions.

The process can then add clock gating circuitry in the IC design to gate a clock input of a multi-bit register cell corresponding to the segment based on the strongest common factor (block 306-5).

Figures 3B, 3C, 3D:
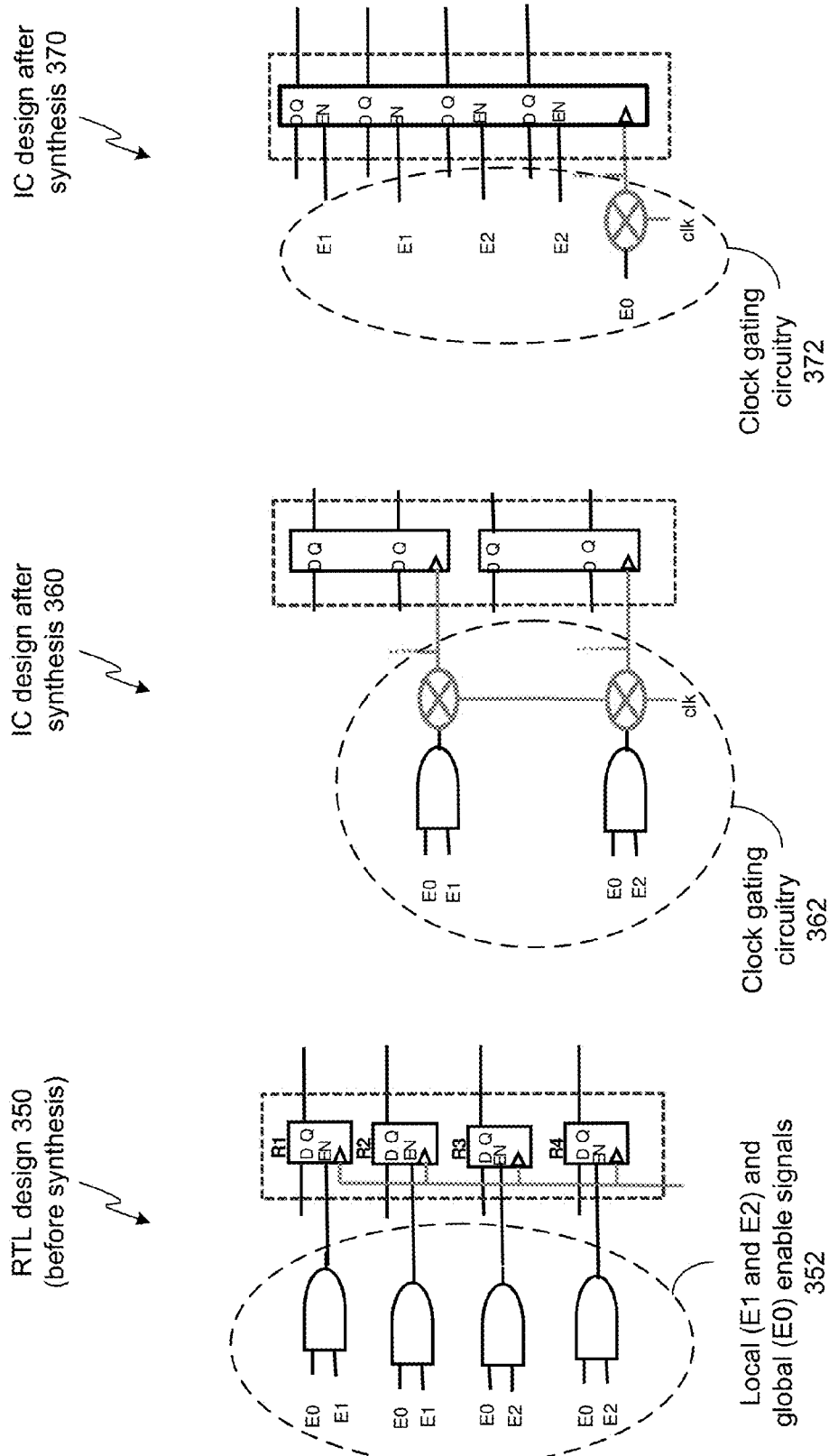
FIGS. 3B-3D illustrate an example of multi-bit-mapping aware clock gating in accordance with some embodiments described herein.

FIGS. 3B-3D illustrate an example of multi-bit-mapping aware clock gating in accordance with some embodiments described herein. FIG. 3B illustrates RTL design 350 (i.e., the IC design before synthesis) that includes four registers (R1-R4), wherein each register has a clock input and an enable input. FIG. 3B also shows the local (E1 and E2) and global (E0) enable signals 352. Registers R1 and R2 in RTL design 350 are enabled by the conjunction of enable signals E0 and E1, and registers R3 and R4 in RTL design 350 are enabled by the conjunction of enable signals E0 and E2. During synthesis, elements in RTL design 350 are mapped to one or more library cells. Some embodiments described herein can use the wide-bus information stored in the IC design to intelligently map registers in RTL design 350 to specific multi-bit register cells depending on the capabilities of the multi-bit register cells.

For example, FIG. 3C illustrates IC design after synthesis 360 when the cell library includes multi-bit register cells that do not have distinct enable pins for each bit. As shown in FIG. 3C, registers R1 and R2 can be mapped to one 2-bit register cell (the top 2-bit register cell), and registers R3 and R4 can be mapped to another 2-bit register cell (the bottom 2-bit register cell). Clock gating circuitry 362 (which can be determined and added to the IC design as explained in reference to FIG. 3A) can appropriately gate the clock signal based on local (E1 and E2) and global (E0) enable signals.

Likewise, FIG. 3D illustrates IC design after synthesis 370 when the cell library includes multi-bit register cells that have distinct enable pins for each bit. As shown in FIG. 3D, registers R1-R4 can be mapped to a single 4-bit register cell. Clock gating circuitry 372 (which can be determined and added to the IC design as explained in reference to FIG. 3A) can appropriately gate the clock signal based on local (E1 and E2) and global (E0) enable signals.

Identification and Preservation of Slices

As mentioned above, a bus is a set of wires in an IC design that carries units of information among different parts of the IC design. Each wire in the bus typically carries a portion of a unit of information (e.g., a 128-bit word). Since the wires on the bus typically carry different portions of the same unit of information, they often undergo the same kind of processing. Therefore, each wire in a bus is often connected to a separate instance of the same sequential and/or combinational logic.

Existing synthesis techniques independently optimize each of these instances of the same sequential and/or combinational logic, which can increase the synthesis runtime because each instance is separately and independently synthesized. Moreover, existing synthesis techniques can result in suboptimal results in cases where uniform structure and regularity of design implementation is required. A non-uniform implementation generated by existing techniques can lead to a non-uniform placement, and in some cases this irregularity can lead to poor results.

In this disclosure, the term "slice" can refer to a circuit comprising sequential and/or combinational logic that occurs at multiple locations with similar timing context in the IC design. The term "slice instance" in this disclosure refers to an instance of a slice. For example, the term "slice" can refer to the sequential and/or combinational logic that is connected to each wire of a bus. Thus, if a bus has 48 wires, and each wire is connected to a distinct instance of the same sequential and/or combinational logic, then the sequential and/or combinational logic can be referred to as a "slice," and each of the 48 instances of sequential and/or combinational logic can be referred to as a "slice instance." As another example, one slice can correspond to multiple bits of the 48-bit bus, and the mapping for one slice can be duplicated across the width of the bus, e.g., each slice can be a single 4-bit multi-bit register, resulting in 12 slice instances across the 48-bit bus. Note that the slices are uniform, and the mapping for one slice is duplicated across the width of the bus. As yet another example, if each byte in a 32-byte word is processed in parallel by instances of the same sequential and/or combinational logic, then the sequential and/or combinational logic can be referred to as a "slice," and each of the 32 instances of sequential and/or combinational logic can be referred to as a "slice instance." Some embodiments described herein identify slices in an RTL description of an IC design, and use the identified slices to improve the performance and/or QoR of IC synthesis and/or optimization.

Figure 4A:
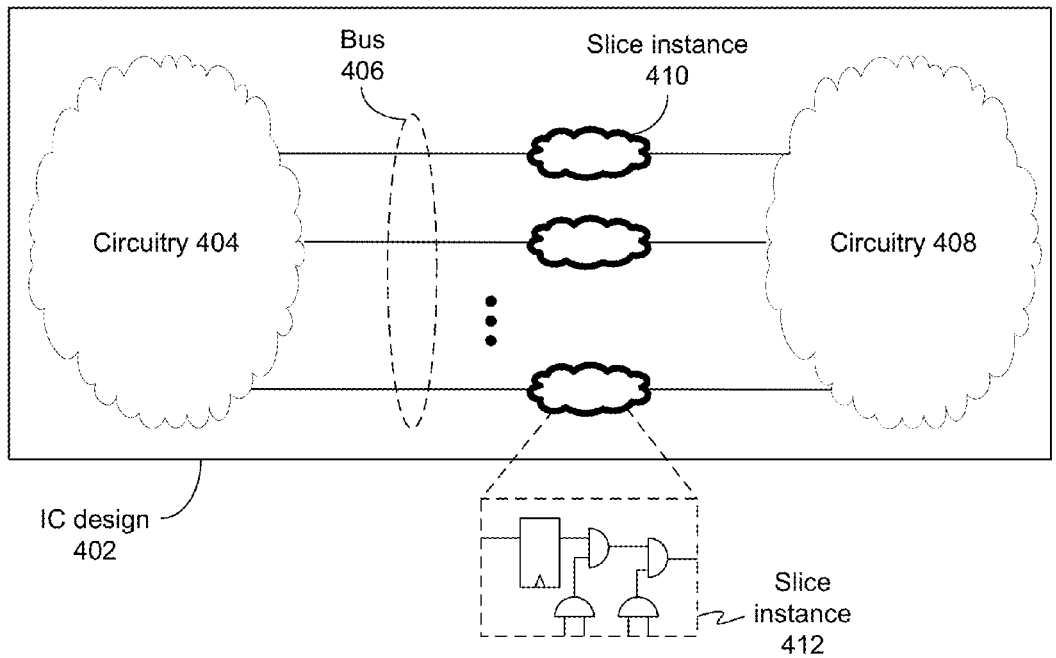
FIG. 4A illustrates a slice in accordance with some embodiments described herein.

FIG. 4A illustrates a slice in accordance with some embodiments described herein. IC design 402 can include circuitry 404, bus 406, circuitry 408, and a set of slice instances, such as slice instances 410 and 412. Each wire of bus 406 can be electrically connected to an instance of the same sequential and/or combinational logic, such as slice instance 410 (shown only as a cloud) and slice instance 412 (shown as a cloud with an inset that shows details within the cloud). Note that a slice instance can include only sequential logic, only combinational logic, or both sequential and combinational logic (e.g., slice instance 412).

Figure 4B:
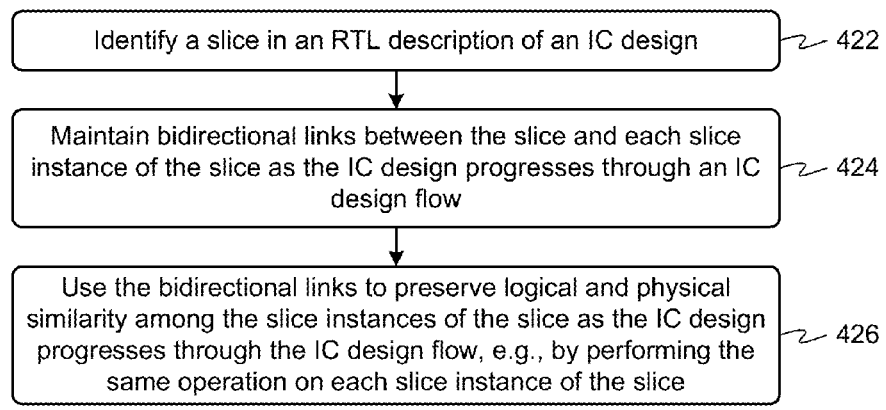
FIG. 4B illustrates a process for using slices in an IC design flow in accordance with some embodiments described herein.

FIG. 4B illustrates a process for using slices in an IC design flow in accordance with some embodiments described herein. The process can begin by identifying a slice in an RTL description of an IC design (block 422). In some embodiments, each wire of each wide-bus can be assumed to be connected to a slice instance. In these embodiments, the process can select a wide-bus, and determine the set of wires that correspond to the wide-bus. Next, for each wire of the wide-bus, the process can identify and compare the circuitry that is in proximity to the wire. For example, in some embodiments, the process can identify and compare the circuitry that is within a downstream logic cone of the wire by performing a breadth-first traversal on the net that the wire is connected to in the IC design. If the circuitry in proximity to each wire is the same, then the process can conclude that a possible slice has been identified in the IC design.

Next, the process can analyze the timing context for each potential slice instance, and group the potential slice instances into slice instance groups based on the timing contexts. The term "timing context" refers to timing parameter values (e.g., slack, transition time, etc.) at a set of terminals (e.g., inputs and outputs of logic gates) in a slice instance, or generally in a portion of the IC design. Note that each slice instance can include multiple terminals, and each terminal can be associated with a slack value. Specifically, two slice instances can be assigned to the same slice instance group if the maximum difference between a slack value of one slice instance and the corresponding slack value of the other slice instance is less than a slack difference threshold.

Note that the process can create multiple slice instance groups for a wide-bus. For example, suppose a wide-bus has 48 wires, and the process has determined that each wire is connected to a distinct instance of the same sequential and/or combinational logic. Next, suppose the process compares the timing contexts of the 48 slice instances and groups the wires into 12 groups of 4 wires each. Then, at this point the process would have identified 12 distinct slices, with each slice having 4 slice instances.

Once the process identifies slices in the IC design, the process can store this information and use it in subsequent steps (e.g., placement, routing, optimization, legalization, etc.) of the IC design flow for improving runtime and/or QoR. In some embodiments, any transformation (placing a cell at a particular location, upsizing a cell, downsizing a cell, rerouting a net, etc.) that is applied to one of the slices is also applied to the other slices. Specifically, the process can create and maintain bidirectional links between the slice and each slice instance of the slice as the IC design progresses through an IC design flow (block 424). Next, the process can use the bidirectional links to preserve logical and physical similarity among the slice instances of the slice as the IC design progresses through the IC design flow, e.g., by performing the same operation on each slice instance of the slice (block 426).

Figure 4C:
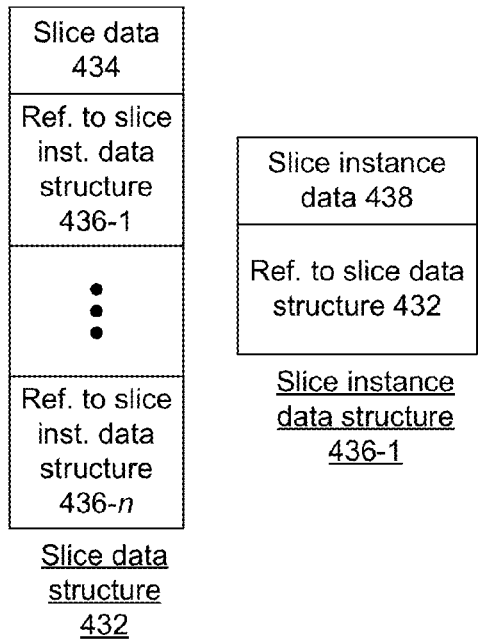
FIG. 4C illustrates an example of how bidirectional links between the slice and each slice instance of the slice can be maintained in accordance with some embodiments described herein.

FIG. 4C illustrates an example of how bidirectional links between the slice and each slice instance of the slice can be maintained in accordance with some embodiments described herein. Slice data structure 432 can include slice data 434 that contains information about the slice, e.g., a unique identifier that enables an EDA tool to uniquely reference the slice. Slice data structure 432 can also include a set of references to data structures that contain information about the slice instances. As shown in FIG. 4C, slice data structure 432 can include references to slice instance data structures 436-1 through 436-n. Each slice instance in the IC design can correspond to a distinct data structure that is stored in memory. Each slice instance data structure, e.g., slice instance data structure 436-1 can include (1) slice instance data 438, which can include information about the slice instance (e.g., a net that describes the circuitry of the slice instance), and a unique identifier that enables an EDA tool to uniquely reference this slice instance, and (2) a reference to the slice data structure 432.

The set of forward references to the slice instances (e.g., references to slice instance data structures 436-1 through 436-n), and the reverse references to the slice (e.g., the reference to slice data structure 432) provide the bidirectional links between the slice and each slice instance of the slice. These bidirectional links can be used to quickly and efficiently access (1) the slice instances for a given slice, and conversely (2) the slice corresponding to a given slice instance. Specifically, a query function in an EDA tool can use the data structures shown in FIG. 4C to (1) look up and return a set of slice instance identifiers or a set of slice instance references based on a query that specifies an identifier or a reference for a slice, (2) look up and return an identifier or a reference for a slice based on a query that specifies an identifier or a reference for a slice instance, and/or (3) look up and return a set of slice instance identifiers or a set of slice instance references based on a query that specifies an identifier or a reference for one of the slice instances in the set of slice instances.

Figure 4D:
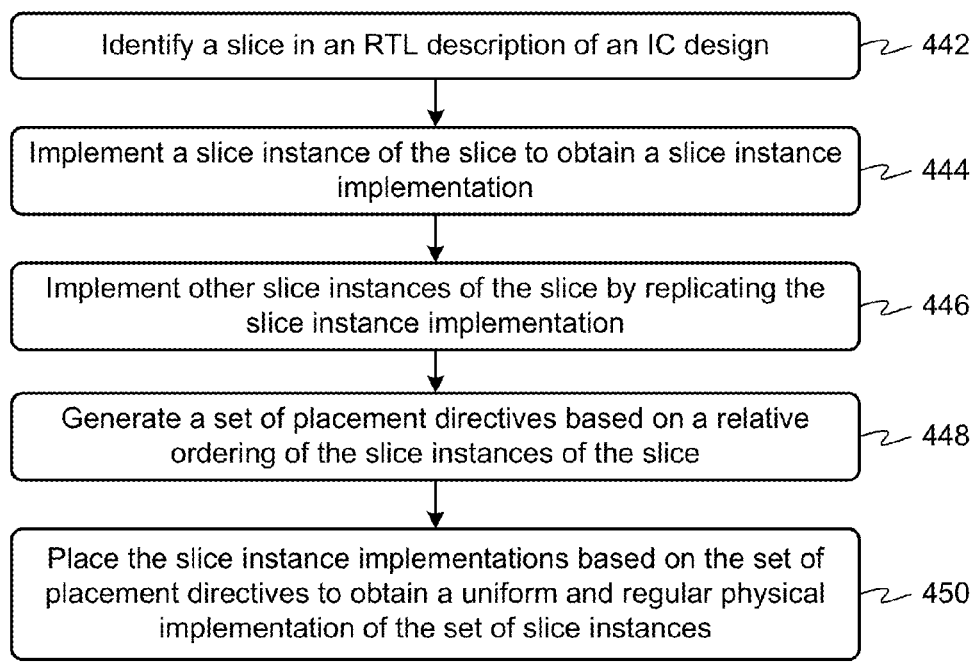
FIG. 4D illustrates a process for using slices to perform one or more IC design flow operations in accordance with some embodiments described herein.

FIG. 4D illustrates a process for using slices to perform one or more IC design flow operations in accordance with some embodiments described herein. The process can begin by identifying a slice in an RTL description of an IC design (block 442). Next, the process can implement a slice instance of the slice to obtain a slice instance implementation (block 444). Implementing a slice instance of the slice can involve replacing components in the RTL description of the slice with corresponding components that are at a lower level of abstraction than RTL (e.g., replacing gates and registers in the RTL description with cells selected from a technology library). The process can then implement other slice instances of the slice by replicating the slice instance implementation (block 446). Note that replicating the slice instance implementation ensures a uniform implementation across all slice instances.

Next, the process can generate a set of placement directives based on a relative ordering of the slice instances of the slice (block 448). The relative ordering of the slice instances can be derived from a relative ordering of circuitry that is electrically connected to the slice instances. For example, the relative ordering of the slice instances can be derived from the relative ordering of the wires of a wide-bus that are electrically connected to the slice instances. In particular, if each wire of bus 406 in FIG. 4A represents a bit in a word, then these wires have an inherent relative ordering, e.g., from the least significant bit of the word to the most significant bit of the word, or vice versa. This relative ordering of the bus wires can be used to generate a relative ordering of the slice instances, e.g., the slice instances that are electrically connected to the bus wires can be ordered in the same relative order as the bus wires. The process can then place the slice instance implementations based on the set of placement directives to obtain a uniform and regular physical implementation of the set of slice instances (block 450).

Figure 4E:
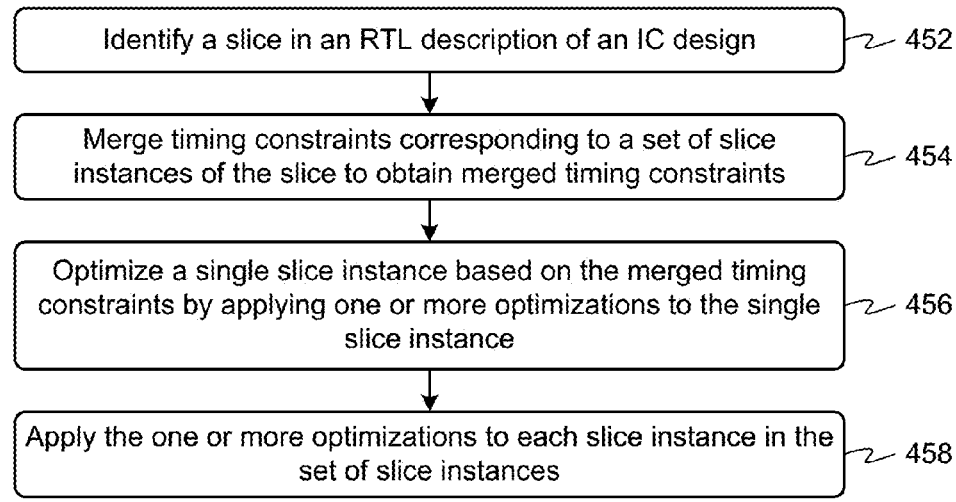
FIG. 4E illustrates a process for using slices during IC design optimization in accordance with some embodiments described herein.

FIG. 4E illustrates a process for using slices during IC design optimization in accordance with some embodiments described herein. The process can begin by identifying a slice in an RTL description of an IC design (block 452). The process can merge timing constraints corresponding to a set of slice instances of the slice to obtain merged timing constraints (block 454). In some embodiments, the process can merge a set of timing constraints by selecting the most stringent timing constraint from the set of timing constraints. For example, suppose a slice instance group includes 20 slice instances, and each slice instance has five timing constraints (e.g., each of the five timing constraints can correspond to a distinct terminal in the slice instance). Then, for each of the five timing constraints, the process can select the corresponding timing constraint that is most stringent across all of the 20 slice instances. The resulting set of five most stringent timing constraints can be referred to as the set of merged timing constraints for slice instance group.

The process can then optimize a single slice instance based on the merged timing constraints by applying one or more optimizations to the single slice instance (block 456). Note that the merged timing constraints correspond to the most stringent timing constraint across all slice instances in the slice instance group. Therefore, optimizing the slice instance to satisfy the merged timing constraints (which capture the most stringent timing constraints across all of the slice instances) ensures that the optimized slice instance will satisfy timing constraints across all slice instances.

Next, the process can apply the one or more optimizations to each slice instance in the set of slice instances (block 458). For example, if the one or more optimizations involves upsizing or downsizing certain cells in the slice instance, then the process can upsize/downsize corresponding cells in each slice instance.

IC Design System

Figure 5:
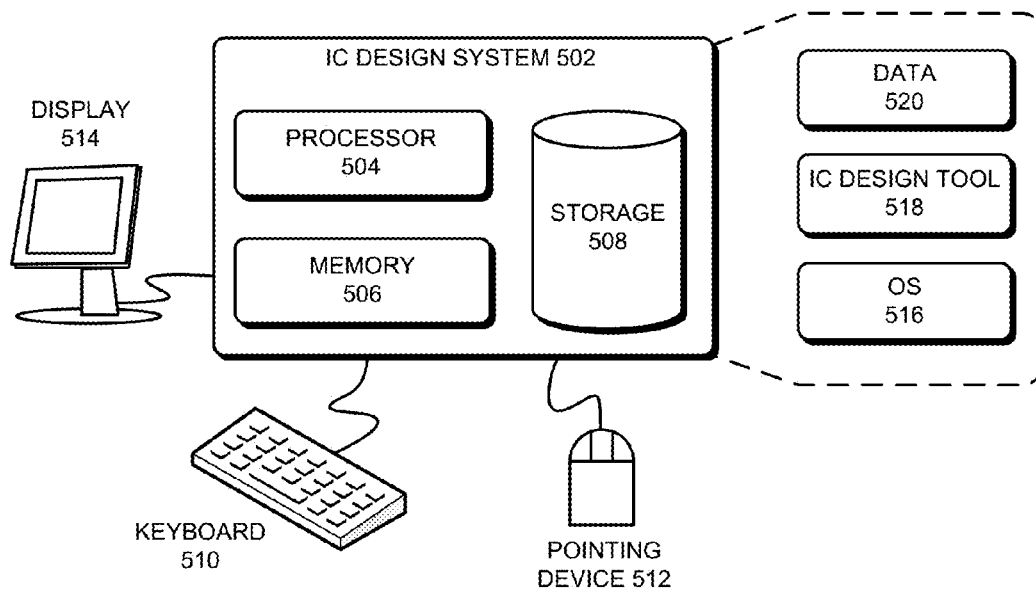
FIG. 5 illustrates an IC design system in accordance with some embodiments described herein.

The term "IC design system" generally refers to a hardware-based system that facilitates designing ICs. FIG. 5 illustrates an IC design system in accordance with some embodiments described herein. IC design system 502 can include processor 504, memory 506, and storage device 508. Specifically, memory locations in memory 506 can be addressable by processor 504, thereby enabling processor 504 to access (e.g., via load/store instructions) and manipulate (e.g., via logical/floating point/arithmetic instructions) the data stored in memory 506. IC design system 502 can be coupled to display device 514, keyboard 510, and pointing device 512. Storage device 508 can store operating system 516, IC design tool 518, and data 520. Data 520 can include input required by IC design tool 518 and/or output generated by IC design tool 518.

IC design system 502 may automatically (or with user help) perform one or more operations that are implicitly or explicitly described in this disclosure. Specifically, IC design system 502 can load IC design tool 518 into memory 506, and IC design tool 518 can then be used to create, edit, view, and optimize IC designs.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A non-transitory computer-readable storage medium storing instructions for an integrated circuit (IC) design tool that, when executed by a computer, cause the computer to perform a method for synthesizing an IC design, the method comprising:

receiving a hardware description language (HDL) description of an IC design, wherein the HDL description includes an HDL statement that defines a multi-bit variable, wherein the multi-bit variable represents a bus;

enumerating the HDL description to obtain an enumerated IC design, wherein said enumerating includes creating, by the IC design tool, a first wide-bus data structure that represents the multi-bit variable; and synthesizing the enumerated IC design to obtain a synthesized IC design, wherein said synthesizing includes creating, by the IC design tool, (1) a second wide-bus data structure that represents the multi-bit variable, (2) a set of individual wire data structures that represents individual wires in the bus, and (3) references that bidirectionally link the second wide-bus data structure with the set of individual wire data structures.

2. The non-transitory computer-readable storage medium of claim 1, wherein the method further comprises:

receiving a query that includes an identifier or a reference for the second wide-bus data structure;

using the references that bidirectionally link the second wide-bus data structure with the set of individual wire data structures to obtain identifiers or references to the set of individual wire data structures; and providing the identifiers or the references to the set of individual wire data structures in response to the query.

3. The non-transitory computer-readable storage medium of claim 1, wherein the method further comprises:

receiving a query that includes an identifier or a reference for an individual wire data structure in the set of individual wire data structures;

using the references that bidirectionally link the second wide-bus data structure with the set of individual wire data structures to obtain an identifier or a reference to the second wide-bus data structure; and providing the identifier or the reference to the second wide-bus data structure in response to the query.

4. The non-transitory computer-readable storage medium of claim 1, wherein, as the IC design progresses through multiple stages of an IC design flow, each representation of the IC design explicitly stores information that bidirectionally links a wide-bus data structure that represents the multi-bit variable with a set of data structures that implement wires corresponding to the multi-bit variable.

5. A method for synthesizing an IC design, the method comprising:
- an IC design tool in a computer receiving a hardware description language (HDL) description of an IC design, wherein the HDL description includes an HDL statement that defines a multi-bit variable, wherein the multi-bit variable represents a bus;
- the IC design tool in the computer enumerating the HDL description to obtain an enumerated IC design, wherein said enumerating includes creating, by the IC design tool, a first wide-bus data structure that represents the multi-bit variable;
- the IC design tool in the computer synthesizing the enumerated IC design to obtain a synthesized IC design, wherein said synthesizing includes creating, by the IC design tool, (1) a second wide-bus data structure that represents the multi-bit variable, (2) a set of individual wire data structures that represents individual wires in the bus, and (3) references that bidirectionally link the second wide-bus data structure with the set of individual wire data structures; and
- wherein the references that bidirectionally link the second wide-bus data structure with the set of individual wire data structures improve a runtime of the IC design tool and/or a quality of results produced by the IC design tool.

6. The method of claim 5, further comprising:
- receiving a query that includes an identifier or a reference for the second wide-bus data structure;
- using the references that bidirectionally link the second wide-bus data structure with the set of individual wire data structures to obtain identifiers or references to the set of individual wire data structures; and
- providing the identifiers or the references to the set of individual wire data structures in response to the query.

7. The method of claim 5, further comprising:
- receiving a query that includes an identifier or a reference for an individual wire data structure in the set of individual wire data structures;
- using the references that bidirectionally link the second wide-bus data structure with the set of individual wire data structures to obtain an identifier or a reference to the second wide-bus data structure; and
- providing the identifier or the reference to the second wide-bus data structure in response to the query.

8. The method of claim 5, wherein, as the IC design progresses through multiple stages of an IC design flow, each representation of the IC design explicitly stores information that bidirectionally links a wide-bus data structure that represents the multi-bit variable with a set of data structures that implement wires corresponding to the multi-bit variable.

9. An integrated circuit (IC) design system, comprising:
- a processor; and
- a non-transitory computer-readable storage medium storing instructions that, when executed by the processor, cause the IC design system to perform a method for synthesizing an IC design, the method comprising:
  - receiving a hardware description language (HDL) description of an IC design, wherein the HDL description includes an HDL statement that defines a multi-bit variable, wherein the multi-bit variable represents a bus,
  - enumerating the HDL description to obtain an enumerated IC design, wherein said enumerating includes creating, by an integrated circuit (IC) design tool, a first wide-bus data structure that represents the multi-bit variable,
  - synthesizing the enumerated IC design to obtain a synthesized IC design, wherein said synthesizing includes creating, by the IC design tool, (1) a second wide-bus data structure that represents the multi-bit variable, (2) a set of individual wire data structures that represents individual wires in the bus, and (3) references that bidirectionally link the second wide-bus data structure with the set of individual wire data structures, and
  - wherein the references that bidirectionally link the second wide-bus data structure with the set of individual wire data structures improve the runtime of the IC design system and/or the quality of results produced by the IC design system.

10. The IC design system of claim 9, wherein the method further comprises:
- receiving a query that includes an identifier or a reference for the second wide-bus data structure;
- using the references that bidirectionally link the second wide-bus data structure with the set of individual wire data structures to obtain identifiers or references to the set of individual wire data structures; and
- providing the identifiers or the references to the set of individual wire data structures in response to the query.

11. The IC design system of claim 9, wherein the method further comprises:
- receiving a query that includes an identifier or a reference for an individual wire data structure in the set of individual wire data structures;
- using the references that bidirectionally link the second wide-bus data structure with the set of individual wire data structures to obtain an identifier or a reference to the second wide-bus data structure; and
- providing the identifier or the reference to the second wide-bus data structure in response to the query.

12. The IC design system of claim 9, wherein, as the IC design progresses through multiple stages of an IC design flow, each representation of the IC design explicitly stores information that bidirectionally links a wide-bus data structure that represents the multi-bit variable with a set of data structures that implement wires corresponding to the multi-bit variable.

* * * * *